United States Patent
Rattier et al.

(10) Patent No.: US 6,987,288 B2
(45) Date of Patent: Jan. 17, 2006

(54) ELECTROLUMINESCENT DEVICE WITH LIGHT EXTRACTOR

(75) Inventors: Maxime Rattier, Palaiseau (FR); Henri Benisty, Paris (FR); Claude Weisbuch, Paris (FR)

(73) Assignees: Centre National de la Recherche Scientifique, Paris (FR); Ecole Polytechnique, Palaiseau (FR)

( * ) Notice: Subject to any disclaimer, the term of this patent is extended or adjusted under 35 U.S.C. 154(b) by 0 days.

(21) Appl. No.: 10/689,784

(22) Filed: Oct. 21, 2003

(65) Prior Publication Data

US 2004/0141333 A1 Jul. 22, 2004

Related U.S. Application Data

(63) Continuation of application No. PCT/FR02/01341, filed on Apr. 18, 2002.

(30) Foreign Application Priority Data

Apr. 26, 2001 (FR) ................................. 01 05652

(51) Int. Cl.
    *H01L 33/00* (2006.01)

(52) U.S. Cl. ........................ 257/98; 257/99; 257/95; 372/45; 372/99; 372/102

(58) Field of Classification Search .............. 257/98, 257/99, 95; 372/45, 50, 96, 99, 102

See application file for complete search history.

(56) References Cited

U.S. PATENT DOCUMENTS

| 5,955,749 A | * | 9/1999 | Joannopoulos et al. ....... 257/98 |
| 6,683,898 B2 | * | 1/2004 | Østergaard et al. ........... 372/43 |

OTHER PUBLICATIONS

Rattier et al., "Ultra-thin, laterally injected light-emitting diodes-the role of photonic crystals for light extraction", *Conference Digest*, Sep. 2000, p. 1.

Erchak et al., "Enhanced Coupling To Vertical Radiation Using a Two-Dimensional Photonic Crystal in a Semiconductor Light-Emitting Diode", *Applied Physics Letters, American Institute of Physics*, vol. 78, No. 5, Jan. 29, 2001, pp. 563-565.

Delbeke et al., "Electrically pumped crystal micro-cavity light emitting diode", *1999 Digest of the Leos Summer Topical Meetings*, pp. 11171-72.

(Continued)

*Primary Examiner*—Minhloan Tran
*Assistant Examiner*—Tan Tran
(74) *Attorney, Agent, or Firm*—Alston & Bird LLP

(57) ABSTRACT

The invention concerns an electroluminescent device comprising first and second substantially parallel mirrors for converting electron-hole pairs into photons, and means for generating electrons and holes. The converting means and the first and second mirrors are designed to ensure the confinement between the first and second mirrors of photons having at least a selected wavelength, associated with a guided propagation mode. Additionally, the device comprises light extracting means which communicate with part at least of the converting means and the generating means, comprised between the first and second mirrors, and are designed to extract therefrom part at least of the photons in guided mode, so that they reach outside.

24 Claims, 2 Drawing Sheets

OTHER PUBLICATIONS

Gourley et al., "Opitcal Properties of Two-Dimensional Photonic Lattices Fabricated as Honeycomp Nanostructures in Compound Semiconductors", *Applied Physics Letters, American Institute of Physics*, vol. 64, No. 6, Feb. 7, 1994, pp. 687-689.

Boroditsky et al., "Light extraction from optically pumped light-emitting diode by thin-slab photonic crystals", *Applied Physics Letters*, vol. 75, No. 8, Aug. 23, 1999, pp. 1036-1038.

Zoorob et al., "Complete Photonic Bandgaps in 12-Fold Symmetric Quasicrystals" *Nature, Macmillan Journals Ltd.*, vol. 404, No. 6779, 2000, pp. 740-743.

David et al., "Wide angularly isotropic photonic bandgaps obtained from two-dimentional photonic crystals with Archimedean-like tilings", *Optic Letters*, vol. 25, No. 14, Jul. 15, 2000, pp. 1001-1003.

International Search Report.

* cited by examiner

ELECTROLUMINESCENT DEVICE WITH LIGHT EXTRACTOR

CROSS-REFERENCE TO RELATED APPLICATIONS

This application is a continuation of PCT Application No. PCT/FR02/01341, filed Apr. 18, 2002, which claims priority from French Patent No. 0105652, filed Apr. 26, 2001, which is hereby incorporated herein in its entirety by reference.

BACKGROUND OF THE INVENTION

This invention relates to electroluminescent devices, such as electroluminescent diodes.

Electroluminescent diodes (or LED) are light emitting devices which are more and more used due to, especially, their low cost, low overall dimension, reliability, sturdiness and high output. These LEDs are used particularly in the fields of displaying, lighting and signalling when they emit in the visible spectrum, or in the field of remote control when they emit in infrared. They are generally made from a semiconductor material, especially of the III-V family, deposited on a substrate, solidarised to a base, and connected to two electrodes, the assembly being accomodated in an epoxy resin dome.

In order to improve the output of these LEDs, it has recently been suggested (see among others the U.S. Pat. No 5,405,710 document) to realise them in the form of stacking, wherein means of electron and hole generation and converting means of electron-hole pairs into photons are placed between a lower mirror (reflective), placed on a substrate, and an upper mirror (semi-reflective) parallel to the lower mirror and communicating with the outside. However, only the photons which are emitted in a significantly normal direction to the plane of the upper mirror and towards the latter, and photons which are emitted in a significantly normal direction to the plane of the lower mirror and towards the latter, are then reflected to the upper mirror, are able to reach the exterior of the device. Consequently, a not negligible part of the photons produced do not reach the exterior of the device.

SUMMARY OF THE INVENTION

The object of the invention is to improve the photon extracting output of this type of electroluminescent device.

For this purpose, it proposes a device of the type presented above and in which the converting means and the upper and lower mirrors (or first and second) are arranged so as to ensure containment, between the mirrors, of the photons which present at least a chosen wavelength in association with a guided propagation mode, and which additionnally includes light extracting means which are arranged in the periphery of the converting means and generating means and which communicate with at least a part of the converting and generating means, which are included between the mirrors, to extract at least a part of photons in the guided mode.

Here a "chosen wavelength" is understood as a peak or a main wavelength of the emission spectrum of the electroluminescent device.

Thus, a large number of photons which are confined between the mirrors and which reach the extracting means may be conducted to the exterior of the device.

According to another characteristic of the invention, extracting means are realised at least in a part of the first and/or second mirrors and/or the generating means and/or the converting means, in the form of a diffracting tridimensional structuration, the dimensions of which are selected as per at least the wavelength of the photons in the guided mode, according to the laws of undulatory optics.

This structuration preferably defines, substantially, a photonic crystal or quasi-crystal formed of holes or columns which constitute the diffracting elements, the dimensions of which are typically about the wavelength of the photons in the guided mode.

Preferably the quasi-crystal is a tiling of convex and substantially edge-jointed polygons and sharing each of their edges with a single neighbour, the size of the edges being, on the other hand, substantially equal to an average selected value to approximately +/−15%.

This tiling may have numerous forms, amongst others:
it can present comparable proportions of squares and equilateral triangles, or first and second angular rhombs with different apexes, the edges of which are approximately similarly sized;
it can be built by periodisation or Stampfli inflation with a pattern including a selected number of equilateral triangles and squares, or first and second angular rhombs with different apexes;
it can be built by an approximately random distribution of selected proportions of equilateral triangles and squares, or first and second angular rhombs with different apexes.

Furthermore, whatever the shape of the tiling may be, it may be slightly twisted, so as to surround at least partly the generating and converting means. This tiling may also be curved so as to extend over at least a part of an annular area.

Furthermore, the tiling of the quasi-crystal may comprise one or several gaps, so as to form a structure of the amorphous type, which is expressed by the absence of one or several diffracting elements in the structuration.

According to yet another characteristic of the invention, the first mirror is semi-reflective and made of an interface between a layer of the generating means and a layer of another material, such as, for example, air or outer epoxy or a material forming a substrate, such as glass, GaP, sapphire, silicon carbide or rutile. Furthermore, the second mirror is preferably made by a stacking of semiconductive(s) or oxide(s) layers pairs, grown, deposited or formed in situ, forming a Bragg's distributed mirror. For this purpose, it is also possible to use semiconductive materials, such as silicon, gallium-, arsenic-, aluminium-, indium-, nitrogen-, phosphorus- and antimony-based compounds, as well as their alloys (for example GaAs, AlAs. GaAlAs, InGaAs et AlGaInP). As regards oxides, may be used, among others, $SiO_2$, $TiO_2$, $HfO_2$, $Ta_2O_5$ and $Al_2O_3$. For example, to obtain a very reflective distributed mirror, a stacking may be formed of alternated layers of GaAs and aluminium oxide, with a stoechiometry close to $Al_2O_3$, obtained by lateral oxidising of a AlGaAs layer, as described in the de J. M. Dallesasse, N. Holonyak Jr, A. R. Stugg. T. A. Richard and N. Elzein, Appll. Phys. Lett. Vol. 57 pp. 2844–2846, 1990, document. Alternatively, the very reflective mirror may be made by metal deposit, such as gold, for example.

A preferential realisation consists in associating a very reflective mirror of the distributed type (for example GaAs/AlOx) and a semi-reflective mirror formed by an outer GaAs/air interface.

In another alternative, both mirrors may be of the distributed type.

The distances separating the mirrors and the characteristics of the materials comprising them are selected so as to define preferably a resonant micro-cavity, especially of the Fabry-Pérot type, or an antiresonant cavity to the wavelengths of the photons emitted by the converting means.

In an advantageous embodiment, the converting means and a part at least of the generating means are constituted of materials selected in a group comprising electroluminescent organic materials, such as organic polymers, conjugated or not, and organometallic complexes, such as $Al_2O_3$, and semiconductors, such as in particular silicon, gallium, aluminium, indium, nitrogen, phosphorus, arsenic and antimony, as well as their alloys.

The device according to the invention presented above is of particular interest when applied as part of an electroluminescent diode.

BRIEF DESCRIPTION OF THE DRAWINGS

Other characteristics and advantages of the invention will be apparent after studying the detailed description hereafter and the annexed drawings in which.

The annexed drawings are essentially of a sure character. Consequently, not only can they be used to complete the invention, but they can also contribute to its definition, as the case occurs.

DETAILED DESCRIPTION OF THE INVENTION

In the following description, reference will be made to an electroluminescent device as part of an electroluminescent diode (or LED), of the type of that illustrated in FIG. 1.

Figure 1:
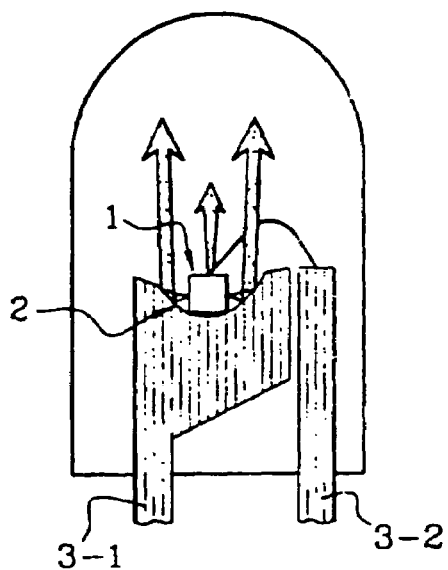
FIG. 1 is a very schematic cross-sectional view of an electroluminescent diode.

More precisely, the diode in FIG. 1 is a diode of the previous art comprising an electroluminescent device 1 placed in a cup-like reflector 2, and connected to two energy supply pins 3-1 and 3-2, one pin 3-2 being placed at a positive potential and the other pin 3-1 at a negative potential, or reversely, as it is known by those skilled in the art.

As indicated in the foreword, the extracting output of photons, which are produced in the electroluminescent devices realised by means of semiconductive materials, is relatively weak. Approximately 5% of photons emitted in the semiconductive material may be recuperated outside by the upper surface. Recently (see especially the document U.S. Pat. No. 5,405,710), the LUCENT company put forward a perfection to the traditional electroluminescent devices. This consists in placing the converting means of the electron-hole pairs into photons between two mirrors which smooth out a magnetogenic micro-cavity of the Fabry-Pérot type. Photons which are emitted to the upper mirror, which communicate with the external air in a substantially perpendicular direction to this upper mirror, up to an angle said "critical angle" (well known by those of the art), reach the exterior of the device and so contribute to lighting. In the same way, photons which are emitted to the lower mirror in a substantially parallel direction to normal of this lower mirror, within a few degrees, may be reflected in the direction of the upper mirror and reach the exterior to contribute to lighting, as is described in particular in the H. Benisty, H. De Neve and C. Weisbuch, document, in IEEE Journal of Quantum Electronics, vol. 34, pp. 1612–1631, 1998. The Lausan Federal Polytechnic School also proposed an improvement to this type of cavity, based on a particular optical stacking of the converting means and generating means of carriers, which may also serve as a basic structure to the present invention. With such a diode, it is possible to reach outputs of about 30%.

In other words, approximately 70% of the photons which are produced by the converting means of the electroluminescent device are lost within the structure. Among these 70%, about 20% go directly to the substrate on which the lower mirror is placed, and are absorbed therein, while the remaining 50% are confined between both mirrors, that is just under the upper surface in the case where the semi-reflective mirror is constituted of a simple interface, itself constituted of a layer of generating means of carriers and a outer material of the device, in the form of a guided mode which propagates and reaches, for the major part, the edge of the structure where it is diffracted to the substrate and thus is absorbed.

Thus the scope of the invention is to improve the situation by providing an electroluminescent device fitted with photon extracting means which will be described here with reference to FIGS. 2 and 3.

Figure 2:
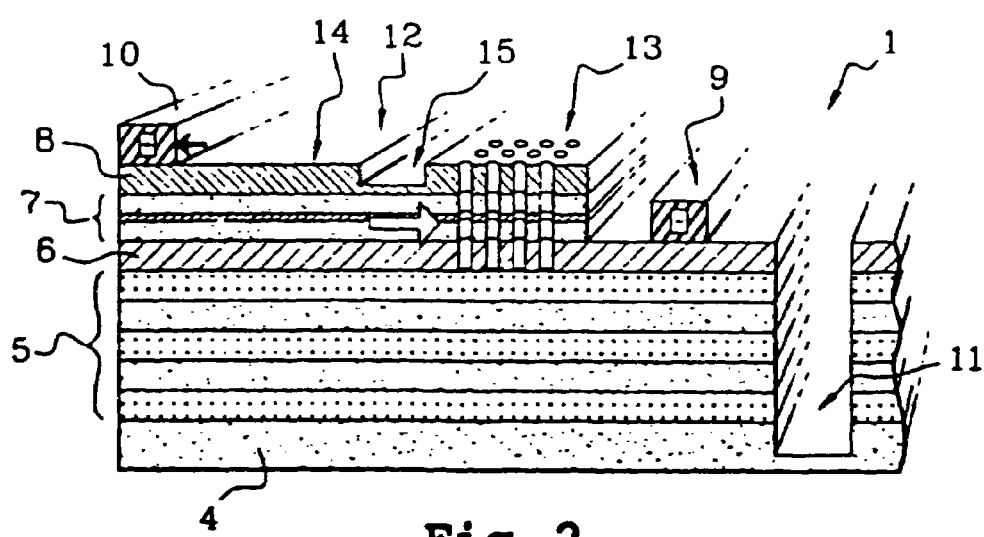
FIG. 2 is a very schematic cross-sectional view of a device according to the invention ensuring light emission in an electroluminescent diode.

In the example illustrated in FIG. 2, the device according to the invention comprises, first of all, a substrate 4 to which a lower reflective mirror 5 is affixed. The upper side of this mirror 5 is affixed to a layer 6 destined to generate carriers, such as electrons.

The upper side of this layer 6 is attached to converting means of electron/hole pairs into photons 7. The upper side of these converting means 7 is attached to a second layer 8 destined to generate carriers of another type to those of the layer 6, for example, holes The generating layers of carriers 6 and 8 are attached to metallic contacts 9 and 10, respectively connected to negative 3-2 and positive 3-1 terminals of the diode. An alternative consists in attaching contact 9 to mirror 5 or to substrate 4 (possibly through the lower side of substrate 4), when substrate 4 and mirror 5 possess also the property of generating carriers. As is well known by those skilled in the art, when contacts 9 and 10 present selected opposite polarisations, the generating layers of carriers 6 and 8 produce respectively electrons and holes, which will recombine in the converting means 7 by producing photons.

Preferably, the converting means 7 are in the form of a quantic well structure, the characteristics of which are selected as per the wavelength that the photons emitted by the diode must have.

So as to allow the lateral oxidising of the Bragg's mirror GaAlAs layers, the stacking defining the device is partly or totally surrounded by one or several deep trenches 11 which extend from layer 8 down to substrate 4.

In the example illustrated in FIG. 2, contact 10 (positive) bears on the upper surface of the holes generating layer 8, while contact 9 (negative) bears on the upper surface of the electrons generating layer 6. To make this contact 9, a part of the electrons generating layer 6 is stripped by defining an upper mesa 12 in the converting means 7 and the holes generating layer 8, by one of the engraving techniques (and/or selective etching) known by those skilled in the art. Preferably, these contacts are realised in the form of metallic electrodes. Moreover, contact 9 preferably surrounds the integrality of mesa 12.

As illustrated in FIG. 2, as an illustration only, mesa 12 may have a circular shape. In this case, contact 9 is preferably realised in the shape of a ring surrounding mesa 12.

Of course, the mesa could have numerous other shapes, such as, for example, a triangular shape, a square or a rectangular shape.

We will now describe an example of materials combined so as to realise an electroluminescent device according to the invention.

First the device comprises a substrate of gallium arsenide (GaAs) on which is grown, for example, by molecular-beam epitaxy, the lower mirror 5. In this example, the mirror is realised first in the shape of a stacking of semi-conductive layers of alternated GaAs and AlGaAs. Lateral oxidising which is made from trenches 11 then turns GaAlAs into AlOx, so defining a highly reflective Bragg's distributed mirror.

The electron generating layer 6 is preferably made in a semiconductive material of the n doped GaAs type. The converting means of electron/hole pairs 7 (or active area) are, for example, realised in the shape of an InGaAs quantic well framed by two AlGaAs barriers. Finally, the holes generating layer 8 is for example realised in a semiconductive material, such as p doped GaAs.

In this example, the upper mirror 14 is constituted of the upper interface between the hole generating layer 8, in p doped GaAs, and external air.

Lower mirror 5 and upper mirror 14 define in this non exhaustive example, a resonant micro-cavity of the Fabry-Pérot type, in which photons produced in the quantic well(s) in directions approximately perpendicular to the planes of the upper and lower mirrors, are transmitted to the outside, the others remaining confined between the mirrors, and especially in the layer constituting the quantic well(s) of the converting means 7 in the form of a guided mode.

In a variation of this, the upper mirror and the lower mirror could define an antiresonant cavity, in which the photons produced in the converting means 7 are forced to remain between the mirrors (practically no light being emitted in a direction substantially perpendicular to the mirror planes).

The scope of the invention is to recuperate all or part of the photons which are confined between the mirrors in the converting means 7 and the carriers generating means 6 and 8, in the form of a guided mode defined by the characteristics of the converting means and the mirrors. For this purpose, it proposes extracting means 13, which will be described now.

The means of extracting light 13 of the invention communicate with the converting means 7 and the carriers generating means 8 preferably as well as 6. As illustrated in FIG. 2, the extracting means 13 are preferably realised in the form of a diffracting tridimensional structuration of a part at least of the carrears generating means (layers 6 and 8) and the converting means 7. It is convenient for manufacture that the tridimensional structuration 13 opens at the upper side of the generating layer 8. Furthermore, it is preferable that the part of the structuration which is formed in the generating layer 8 is totally, or at least in a major part separated from the rest of the generating layer 8, which is attached to contact 10, so as, especially, not to act against the conversion of the photon bearing pairs. To this end, a trench 15 may be made in the whole thickness of the generating layer 8 (or in a fraction only of this thickness), just before the structuration area 13.

This structuration 13 defines the diffracting elements. Consequently, the dimensions of the structuration are selected so as to verify the laws of undulatory optics. In other words, the characteristic dimensions of the tridimensional structuration 13 are typically of the order of the wavelength of the "guided" photons.

In a particularly advantageous manner, the structuration defines, approximately, a photonic crystal or quasi-crystal of holes or material columns. These holes or columns constitute diffracting elements, which will allow for the extraction, by diffraction, of guided photons. They are generally made by a planar lithographic method, resulting from microelectronics and well known by those skilled in the art. The device is first covered by a sensitive resin which is locally submitted to (with a positive resin, at the location of the holes which are to be engraved) a beam of electrons or ultraviolet photons. The resin so downgraded is removed from the stripped surfaces which are then submitted to a wet or dry chemical etching by plasma, destined to dig holes. There are a variety of techniques to obtain the final result, some of them calling for intermediate layers of the silicon type to increase the engraving depth, or for the use of holographic networks to obtain a local modulation of the ultraviolet photon beam. These techniques are also usable for the realisation of other parts of the device, such as deep trenches 11 or electrode 10. Another manner to make diffracting structures particularly adapted to organic materials calls for embossing, stamping or punching.

Since photonic crystals and quasi-crystals are well known objects to those skilled in the art, their way of functioning will not described here in detail.

The photonic crystal or quasi-crystal is defined by a tiling, which may take numerous shapes. It can be a tiling defining a traditional network with a level of symmetry lower or equal to 6. The pattern of the network can, for example, be an equilateral triangle, a square or a hexagon. More generally, the tiling can be constituted of any type of convex and approximately jointed polygons and sharing each of their edges with one and unique neighbour, once these edges are approximately the same size within ±15%.

However, in order to still increase the extracting rate, it is preferable to use more complex tilings, i.e. with levels of symmetry higher than 6. As a matter of fact, as known by those of the art, diffraction is ruled by the law of networks. According to this law, a photon with an incident wave vector $\vec{K}i$ will be diffracted by a network, defined by the vector $\vec{G}$ of its reciprocal space, if final wave vector $\vec{K}f$ follows the relation $\vec{K}f = \vec{K}i + \vec{G}$.

Moreover, according to the Snell-Descartes laws, the photon final wave vector $\vec{K}f$ can be broken down in a perpendicular component $\vec{K}f\perp$, plus a parallel component $\vec{K}f//$. As a consequence, so that the incident photon may flow out in a substantially perpendicular direction, it is necessary that the parallel component of its final wave vector $\vec{K}f//$ be very small or, in other words, that the relation $\vec{K}i + \vec{G} \approx 0$ is obtained. In this case, photons will flow out, by diffraction, substantially perpendicularly to the plane in which they are guided.

So as to allow for collecting the largest possible number of photons, the reciprocal network must, accordingly, be defined by the largest number possible of different vectors $\vec{G}$, but with standards all substantially equal to that of $\vec{K}i$, without this number tending to the infinite, which would correspond to an aperiodic case.

Such "networks" present levels of symmetry which are higher than 6. In a class of realisation proposed hereunder, these networks have a super-period which is typically in micrometers, for example 2 μm. To satisfy the extracting functions, they only need to extend over a small number of super-periods, for example three of four super-periods, in width.

Figures 3A, 3B:
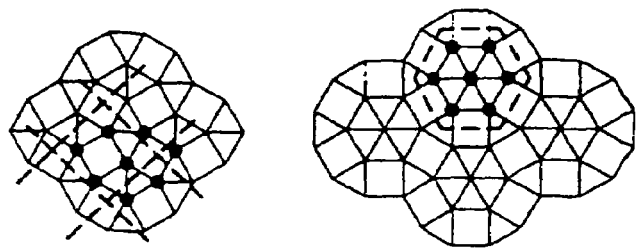
FIGS. 3A to 3G are schematic views illustrating tilings of photonic quasi-crystals that can be used in a device according to the invention to ensure photon extraction.
Figure 3C:
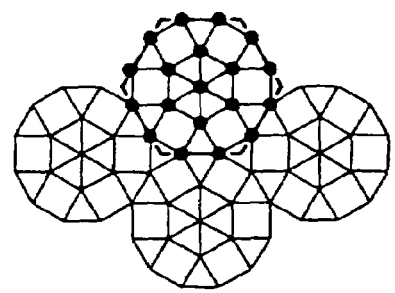
Figure 3D:
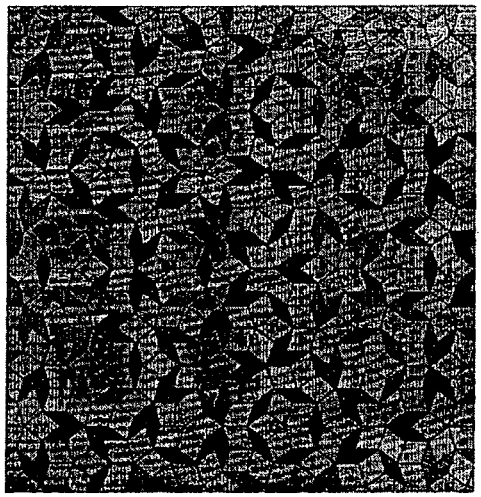

A certain number of tilings correspond to these characteristics. For example, the archimedean tilings formed from equilateral triangles and squares, the edges of which are all the same size (as illustrated in FIGS. 3A to 3C). Another example is the Penrose tilings constituted from two types (first and second) of rhombs, the angles of which at the apex are different but which have edges of same size, as illustrated in FIG. 3D.

Figure 3E:
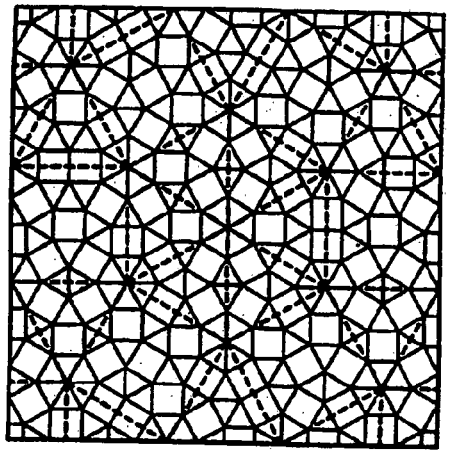
Figure 3F:
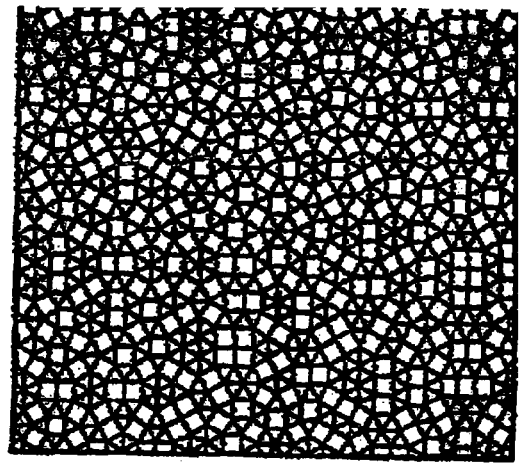

Such tilings can be constituted of substantially equal (or comparable) proportions of squares and equilateral triangles (see FIG. 3A: said "square" network with four atoms per unit cell), or of first and second rhombs. But they can also be constructed by periodisation of a pattern including a selected number of equilateral triangles and squares (as illustrated in FIGS. 3C and 3D: said "real triangular" networks with seven and thirteen atoms per unit cell, respectively; they are in particular described in the document of S. David, A. Chelnokov and J.-M. Lourtioz, <<Wide photonic bandgaps obtained from two-dimensional photonic crystals with Archimedean-like tiling>>, Optics letters, vol 25, Issue 14, pp. 1001–1003, July 2000), or from first and second rhombs. They also can be constructed by Stampfli inflation from a pattern including a selected number of equilateral triangles and squares (as illustrated in FIG. 3E and described in particular in the document of M. Oxborrow and C. L. Henley, "Random square-triangle tilings: A model for twelvefold-symmetric quasicrystals", Phys. Rev. B, val 48, Issue 10, pp. 6966–6998, 1993), or of first and second rhombs. They can also be constructed by a substantially random distribution of selected proportions of equilateral triangles and squares (as illustrated in FIG. 3F), or of first and second rhombs.

In structures of this type, the arrangement of the first and second neighbours of a hole or a column is very variable, but "interatomic" distances between them remain approximately equal.

Of course, the holes or columns may be generated on the edges of the tiling or on its nodes, as selected.

Otherwise, it is preferable that the size of the tiling edges be substantially equal to a selected average value. But, this size could vary around this selected average value within an interval included between about +15% and –15%. Thus, it is possible to start from a tiling which extends over a substantially rectangular band (for example) and twist this tiling, in particular to curve it so that it extends over at least one part of an annular area, or over the whole of an annular area, as illustrated in FIG. 2.

Figure 3G:
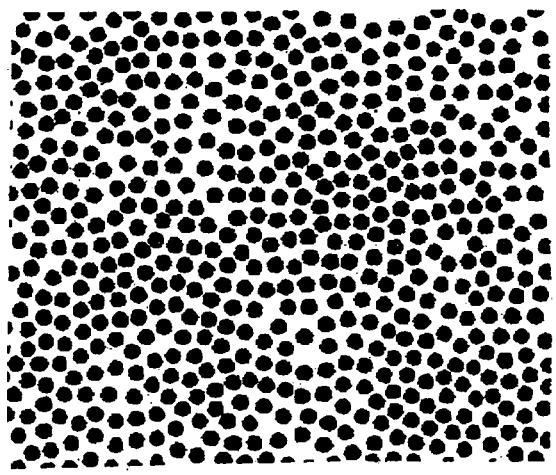

Furthermore, the photonic crystal or quasi-crystal could be carried out in the form of a tiling of the type of those presented above, but in which at least one of the diffracting elements (hole or column) is omitted, so as to form a structure of the amorphous type (as illustrated in FIG. 3G).

Moreover, in the case in which the engraving goes through the carrier generating layer 6 and the mirror 5 is insulating, the conductive material forming the photonic crystal or quasi-crystal must be connex for the electric current, so that the later can flow between holes or under columns.

As illustrated in FIG. 2, the photonic crystal or quasi-crystal destined for the extraction of guided photons, is preferably realised in the periphery of the area in which photons are produced, by conversion of electron-hole pairs.

As an illustrative example, to extract photons with wavelength λ of about 1 μm, guided in a material with optical index n approximately equal to 3, the interatomic distance of the tiling (λ/n) must be included between about 300 nanometers and 400 nanometers. For example, it is possible to realise holes approximately 150 nanometers in diameter and separated one from the other by about 350 nanometers. Furthermore, the depth of the holes (or the height of the columns) could vary according to the thickness of the layers used to form the converting means and the generating means of carriers. Typically, the thickness or the height of these diffracting elements is about a few hundreds of nanometers, for example 200 or 300 nanometers.

The invention is not limited to the embodiments of the devices described above, which were only examples, but it includes all alternatives that those skilled in the art may consider within the scope of the claims hereafter.

As a matter of fact, the configuration of the device could be slightly inverted, the light flowing out through the bearing layer (for example in case of transfer). In this case, the extracting means may however be engraved from the upper layer, if need be, through the upper mirror. For example, a non absorbing substrate with the selected wavelength on which bears a lower semi-reflective mirror, while the upper mirror is highly reflective, can be used. The device could also be transfered to a transparent substrate. Otherwise, mirrors could be realised in metallic materials rather than semiconductors. Accordingly, types of semiconductive materials other than those presented above can be used to obtain different wavelengths. For example, to obtain a red light, AlGaAs alloys, or AlGaInP alloys, as well as AlOx distributed mirrors, placed on a GaAs substrate can be used. In this case, the edges of the tiling may have lengths of about 200 to 300 nm. But types of materials other than semiconductors could also be used, such as, for example organic materials, such as organic polymeres, conjugated or not, and organometallic complexes.

What is claimed is:

1. An electroluminescent device comprising a substrate, a lower mirror carried by the substrate, an electron generating layer formed on the lower mirror, a conversion layer formed on the electron generating layer, a hole generating layer formed on the conversion layer, an upper mirror on the hole generating layer, said conversion layer converting electron-hole pairs into photons and said lower and upper mirrors ensuring containment of the photons presenting at least a selected wavelength associated to a guided propagation mode, and light extraction means arranged only in the periphery of the generating and conversion layers and communicating with at least a part of the generating and conversion layers to extract at least a part of the photons in the guided mode from the said generating and conversion layers.

2. A device according to claim 1, wherein said light extracting means are realised at least in a part of the lower and upper mirrors and the generating layer and the conversion layer in the form of a diffracting tridimensional structuration with dimensions selected based on at least the wavelength of the photons in the guided mode.

3. A device according to claim 2, wherein said structuration substantially defines a photonic quasi-crystal of holes or columns constituting diffracting elements, with dimensions of about the wavelength of photons in the guided mode.

4. A device according to claim 3, wherein said quasi-crystal is a tiling of convex substantially jointed polygons and sharing each of their edges with an unique neighbour, said size of the edges being substantially equal to a selected average value, with a percentage close to within approximately +15% and −15%.

5. A device according to claim 4, wherein said tiling is constituted of substantially equal proportions of squares and equilateral triangles, or of first and second angular rhombs with different apexes, with substantially equal-sized edges.

6. A device according to claim 4, wherein said tiling is constructed by periodisation of a pattern including a selected number of equilateral triangles and squares, or first and second angular rhombs with different apexes.

7. A device according to claim 4, wherein said tiling is constructed by Stampfli inflation of a pattern comprising a selected number of equilateral triangles and squares, or first and second angular rhombs with different apexes.

8. A device according to claim 4, wherein said tiling is constructed by a substantially random distribution of selected proportions of equilateral triangles and squares, or of first and seconds angular rhombs with different apexes.

9. A device according to claim 4, wherein said tiling is twisted so as to surround at least partly said generating means and said converting means.

10. A device according to claim 4, wherein said tiling is curved so that it can extend over at least a part of an annular area.

11. A device according to claim 4, wherein said quasi-crystal is a tiling in which at least one of the diffracting elements is omitted so as to form a structure of the amorphous type.

12. A device according to claim 2, wherein said extracting means are realized at least in a part of the hole generating layer and of the conversion layer.

13. A device according to claim 2, wherein said extracting means are realized at least in a part of the election generating layer, of the conversion layer and of the hole generating layer.

14. A device according to claim 2, wherein said extracting means are realized at least in a part of the election generating layer, of the conversion layer, of the hole generating layer and of the upper mirror.

15. A device according to claim 1, wherein the upper mirror is of the semi-reflective type and constituted by an interface between the hole generating means and an upper layer of another material.

16. A device according to claim 15, wherein said other material is selected from a group comprising air, epoxy and a material forming the substrate.

17. A device according to claim 1, wherein the lower mirror is a reflective mirror of the Bragg's mirror type placed on the substrate.

18. A device according to claim 1, wherein the converting means and a part at least of the generating means are constituted of materials selected from a group comprising semiconductors and organic electroluminescent materials.

19. A device according to claim 18, wherein said organic materials are selected from a group comprising organic polymers, conjugated or not, and organometallic complexes.

20. A device according to claim 18 wherein said semiconductors are selected from a group consisting of silicon, gallium-, aluminium-, indium-, nitrogen-, phosphorus-, arsenic- and antimony-based compounds, as well as their alloys.

21. A device according to claim 18 that comprises i) an ordered stacking of GaAs substrate, alternating layers of GaAs and AlAs forming said second mirror, a n doped GaAs layer, forming a part of the generating means, an active layer constituted of two AlGaAs barriers framing a quantic well in InGaAs and forming said converting means, a n doped GaAs layer forming another part of the generating means as well as said first mirror with a layer of outer air, and ii) a first means of electric contact to enable the p doped GaAs layer to be placed under a positive polarisation and a second means of electric contact suitable to place the n doped GaAs layer to be placed under a negative polarisation.

22. A device according to claim 1, wherein the upper and lower mirrors define a resonant cavity of the Fabry-Pérot type.

23. A device according to claim 1, wherein the upper and lower mirrors define an anti-resonant cavity with the wavelength of the photons emitted by the converting means.

24. An electroluminescent diode, comprising a device according to claim 1.

* * * * *